US008963530B2

(12) United States Patent
Park

(10) Patent No.: US 8,963,530 B2

(45) Date of Patent: Feb. 24, 2015

(54) MULTI INPUT CIRCUIT

(75) Inventor: Hwan Ki Park, Busan (KR)

(73) Assignee: Autonics Corporation, Busan (KR)

( * ) Notice: Subject to any disclaimer, the term of this patent is extended or adjusted under 35 U.S.C. 154(b) by 273 days.

(21) Appl. No.: 13/640,886

(22) PCT Filed: Jul. 11, 2012

(86) PCT No.: PCT/KR2012/005521

§ 371 (c)(1), (2), (4) Date: Oct. 12, 2012

(87) PCT Pub. No.: WO2012/177107

PCT Pub. Date: Dec. 27, 2012

(65) Prior Publication Data

US 2013/0027015 A1 Jan. 31, 2013

(30) Foreign Application Priority Data

Jul. 15, 2011 (KR) ........................ 10-2011-0070227
Oct. 24, 2011 (KR) ........................ 10-2011-0109008

(51) Int. Cl.

| | |
|---|---|
| ***G05F 1/44*** | (2006.01) |
| ***G01K 7/02*** | (2006.01) |
| ***H03K 19/173*** | (2006.01) |
| ***G01K 7/20*** | (2006.01) |

(52) U.S. Cl.

CPC ............ *G01K 7/021* (2013.01); *H03K 19/1732* (2013.01); *G01K 7/20* (2013.01)

USPC .......................................................... 323/285

(58) Field of Classification Search

None

See application file for complete search history.

(56) References Cited

U.S. PATENT DOCUMENTS 5,703,575 A * 12/1997 Kirkpatrick ........... 374/E15.001
5,829,876 A * 11/1998 Schwartz et al. ................ 374/1
5,876,122 A * 3/1999 Eryurek ........................ 374/183
6,045,260 A * 4/2000 Schwartz et al. ............ 374/183
7,658,539 B2 * 2/2010 Engelstad .................... 374/163
2008/0133170 A1 * 6/2008 Engelstad .................... 702/130
2010/0316086 A1 * 12/2010 Engelstad et al. ............... 374/1
2013/0182741 A1 * 7/2013 Engelstad et al. ............... 374/1

FOREIGN PATENT DOCUMENTS

| | | | |
|---|---|---|---|
| JP | H05-062829 | U | 8/1993 |
| KR | 10-1997-0000457 | B1 | 1/1997 |
| KR | 10-0148920 | B1 | 12/1998 |
| KR | 10-2010-0012318 | A | 2/2010 |

OTHER PUBLICATIONS

English language Abstract for KR 10-2010-0012318 A.
English language Abstract for KR 10-1997-0000457 B1.
English language Abstract for KR 10-0148920 B1.
International Search Report mailed on Nov. 1, 2012.

* cited by examiner

*Primary Examiner* — Jermele M Hollington

(74) *Attorney, Agent, or Firm* — Hershkovitz & Associates, PLLC; Abraham Hershkovitz

(57) ABSTRACT

A multi input circuit is provided having a first terminal; a second terminal; a third terminal; a current element sensing signal detection unit connected between the first terminal and the third terminal; a multiplexer of which input ports are each connected to the first to third terminals and an output end of the current element sensing signal detection unit; a key input unit selecting the input ports for receiving the sensing signals from the multiplexer; a power supply unit; a switch turning-on/off power supplied to the RTD temperature sensor from the power supply unit; and a control unit outputting a control signal selecting the input ports of the multiplexer and a control signal controlling the turn-on/off of the switch according to the selection of the key input unit to receive the sensing signal input to the input port of the multiplexer.

8 Claims, 6 Drawing Sheets

MULTI INPUT CIRCUIT

TECHNICAL FIELD

The present invention relates to a multi input circuit for a control measuring instrument enabling one of control measuring instruments such as a temperature controller, a panel meter, and the like, to receive various types of signals, and more particularly, to a multi input circuit for a control measuring instrument allowing the same input terminal of the control measuring instrument to receive any signal of a Thermo-Coupler (hereinafter as "TC") temperature sensor signal, a Resistance Temperature Detector (hereinafter as "RTD") temperature sensor signal, an analog voltage signal, and an analog current signal as inputs mainly used in the control measuring instrument so as to reduce the number of input terminals and simplify a configuration of the input circuit.

BACKGROUND ART

Generally, a recent trend is for control measuring instruments, such as a temperature controller, a signal converter, a panel meter, and the like, to receive various possible electrical signals using a simple input circuit so as to implement operation convenience of a user, extension of applications, and saving of manufacturing costs. FIGS. 1 to 3 show a configuration example of a multi input circuit according to the related art so as to simplify an input circuit.

First, one configuration example according to the related art shown in FIG. 1 consists of a temperature sensor signal input terminal and a current signal input terminal, respectively, wherein an RTD temperature sensor signal is received through a first terminal, a second terminal, and a third terminal and a TC temperature sensor signal or a voltage signal is received through the second terminal and the third terminal, but a current signal needs to be converted into the voltage signal and therefore, is received by a current signal detection resistor through the third terminal and a fourth terminal connected at both ends of the detection resistor.

However, the input circuit as described above is simple in terms of a configuration but requires a relatively large number of input terminals, such that manufacturing costs are increased and there is a limitation in miniaturization of products.

Another configuration example according to the related art of FIG. 2 relates to a method of passively connecting a current signal detection resistor using a separately provided input select switch 10 when an analog current signal is an input to convert and input the input current signal into voltage by the detection resistor, instead of commonly using a temperature sensor signal input terminal and an input terminal of an analog voltage signal or an analog current signal so as to minimize the number of input terminals, such that the input terminal and the configuration circuit may be simplified, but there may be inconvenience due to the use of the separate input select switch 10, the measuring error may occur due to the contact resistance of the input select switch 10, and the manufacturing costs may be increased.

Yet another configuration example according to the related art of FIG. 3 relates to a method for simplifying the input terminal and the configuration circuit and is similar to the method shown in FIG. 2, but is a method of allowing a user to separately wire a current signal detection resistor 20 for receiving the analog current signal instead of the input select switch 10 to an outside of a terminal, such that the input terminal and the configuration circuit may be simplified but the user inconvenience may be caused, there may be a difficulty in handling due to the equipping of current signal detection resistor 20, and it is impossible to implement the automation of the input selection.

DISCLOSURE

Technical Problem

An object of the present invention is to provide a multi input circuit capable of reducing manufacturing costs and miniaturizing products by allowing the same input terminal of control measuring instrument, such as a temperature controller, a panel meter, and the like, to receive a temperature sensor signal, an analog voltage signal, and an analog current signal and allowing to perform an input selection of various types of signals only by setting key operation of a control unit for each input signal.

Technical Solution

A multi input circuit according to an exemplary embodiment of the present invention includes a first terminal being supplied with sensing signals of a current means, an RTD temperature sensor, and a TC temperature sensor; a second terminal being supplied with a compensation signal of the RTD temperature sensor and a sensing signal of the voltage means; a third terminal being supplied with a common signal of the current means, the RTD temperature sensor, the TC temperature sensor, and the voltage means and being grounded; a current means sensing signal detection unit connected between the first terminal and the third terminal; a multiplexer of which input ports are each connected to the first to third terminals and an output end of the current means sensing signal detection unit; a key input unit selecting the input ports for receiving the sensing signals from the multiplexer; a power supply unit supplying power for sensing a change in a resistance value of the RTD temperature sensor; a switch turning-on/off power supplied to the RTD temperature sensor from the power supply unit by receiving the signal from the control unit; and a control unit outputting a control signal selecting the input ports of the multiplexer and a control signal controlling the turn-on/off of the switch according to the selection of the key input unit to receive the sensing signal input to the input ports of the multiplexer.

The current means sensing signal detection unit comprises a switching device and a detection resistor connected in series between the first terminal and the third terminal and a detection signal output end of the detection resistor is connected to one input port of the multiplexer.

The switching device according to an exemplary embodiment may consist of a diode and may be configured to allow the detection resistor to detect only a current signal input at voltage higher than a threshold voltage of the diode.

The switching device according to another embodiment may consist of a transistor and may be configured to input a control signal input from the control unit to the switching device to a base of the transistor at the time of measuring the sensing signal of the current means to turn-on the transistor.

When any one of the signals of the RTD temperature sensor, the TC temperature sensor, the current means, or the voltage means is input to the first terminal, the second terminal, and the third terminal, the control unit may be configured to selectively receive the signal by the selection of the multiplexer.

Advantageous Effects

According to the embodiments of the present invention, it is possible to reduce the manufacturing costs and miniaturize the products by allowing the same input terminal of the control measuring instrument, such as the temperature controller, the panel meter, and the like, to receive the temperature sensor signal, the analog voltage signal, and the analog current signal so as to differentiate the types of the signals using the diode.

Further, it is possible to increase the use convenience by removing the input select switch and improve the measuring degree by reducing the measuring error due to the contact resistance of the input select switch.

BEST MODE

Hereinafter, a configuration and an operation of an exemplary embodiment of a multi input circuit according to an exemplary embodiment of the present invention will be described in detail with reference to the accompanying drawings.

Figure 1:
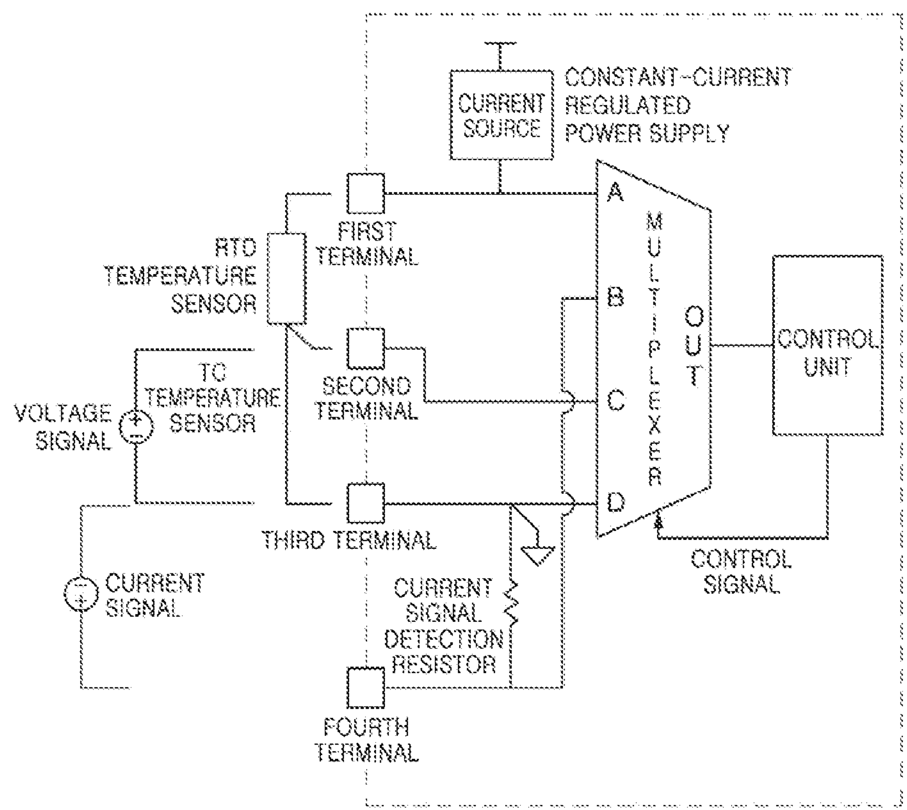
FIGS. 1 to 3 are configuration diagrams of a control measuring instrument according to the related art.
Figure 2:
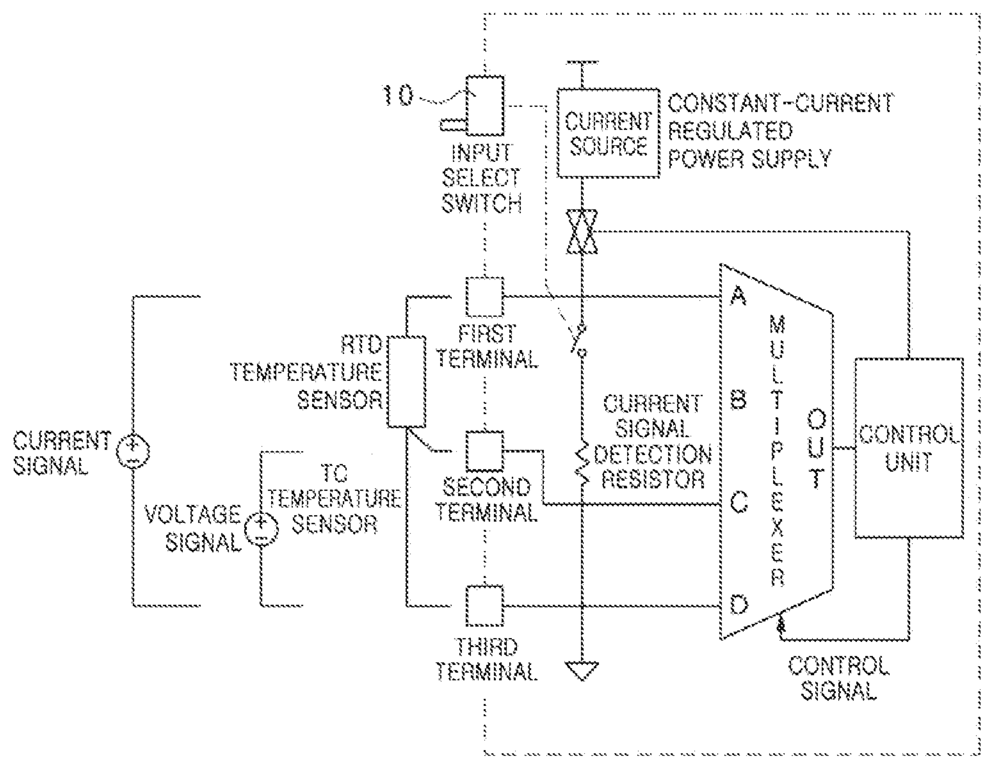
Figure 3:
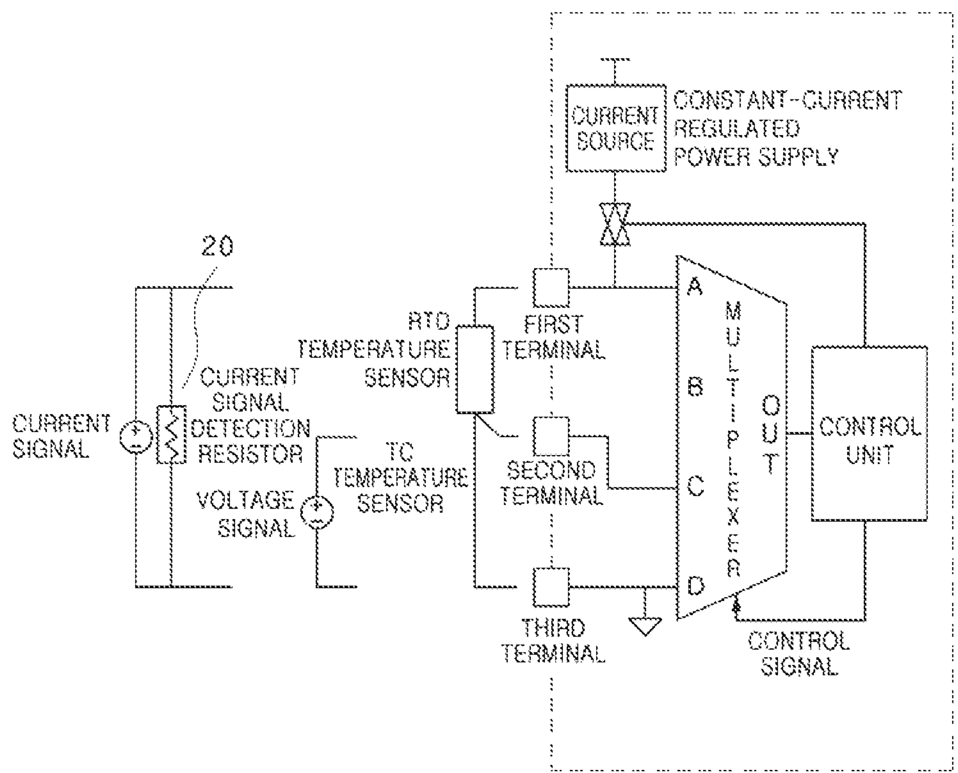
Figure 4:
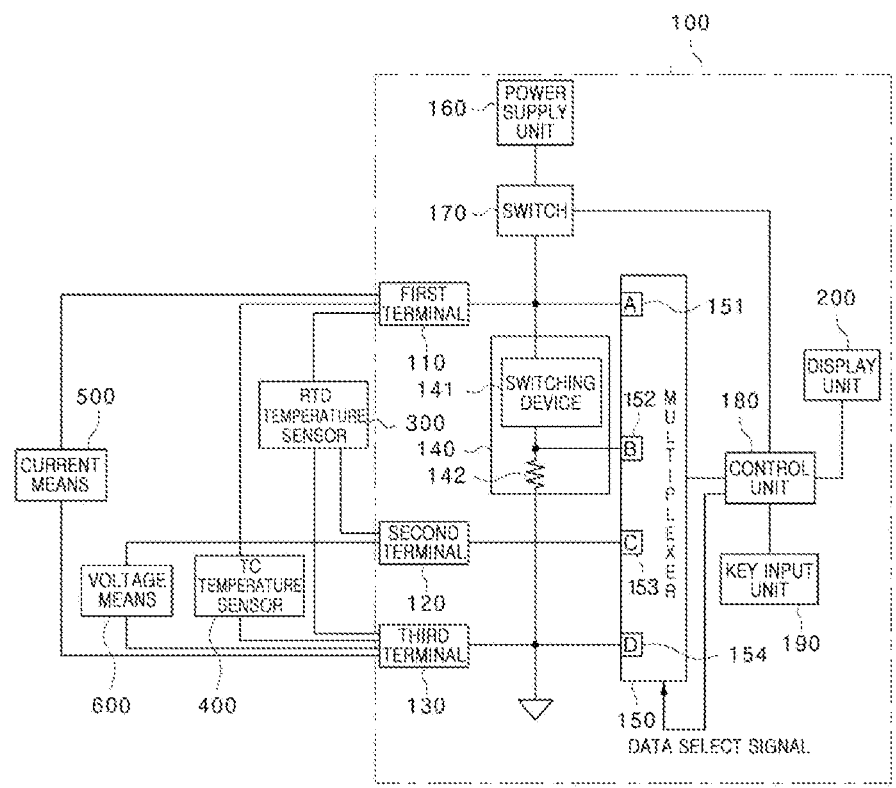
FIG. 4 is a configuration diagram of a multi input circuit according to an exemplary embodiment of the present invention to which a current means, a voltage means, an RTD temperature sensor, and a TC temperature sensor are connected.

As shown in FIG. 4, a multi input circuit 100 includes a first terminal 110, a second terminal 120, a third terminal 130, a current means sensing signal detection unit 140, a multiplexer 150, a power supply unit 160, a switch 170, a control unit 180, and a key input unit 190. In addition, as described below, a display unit 200 may be connected to an output end of the control unit 180 which may receive and display sensing signals of an RTD temperature sensor 300, a TC temperature sensor 400, a current means 500 and a voltage means 600 which may be connected to the first terminal 110 to the third terminal 130 of the multi input circuit 100.

The first terminal 110 is a terminal receiving the signals sensed by the RTD temperature sensor 300 and the TC temperature sensor 400 or the current means 500 and each temperature signal and current signal sensed and transmitted by the RTD temperature sensor 300 and the TC temperature sensor 400 or the current means 500 are input to the multiplexer 150 to be described below.

The second terminal 120 is a terminal receiving a compensation signal of the RTD temperature sensor 300 and the sensing signal of the voltage means 600 and the compensation signal and the voltage signal transmitted from the RTD temperature sensor 300 and the voltage means 600 are input to the multiplexer 150 to be described below.

The third terminal 130 is a terminal to which a common terminal of the RTD temperature sensor 300, the TC temperature sensor 400, the current means 500 and the voltage means 600, and the multiplexer 150 is connected.

The current means sensing signal detection unit 140 is a means that converts the current signal sensed by the current means 500 into the voltage signal that may be recognized by the control unit 180 and inputs the converted voltage signal to one input port of the multiplexer 150 and may consist of a switching device 141 and a detection resistor 142.

The switching device 140 is turned-on only when intending to receive the sensing signal of the current means 500 through the multiplexer 150 so that the current signal sensed by the current means 500 is converted into the voltage signal by the detection resistor 142 and is then input to the control unit 180.

The multiplexer 150 is connected to the first terminal 110, the second terminal 120, the third terminal 130, and an output end of the current means sensing signal detection unit 140 and includes an A terminal 151, a B terminal 152, a C terminal 153, and a D terminal 154.

In this configuration, the A terminal 151, the B terminal 152, the C terminal 153, and the D terminal 154 are input ports through which external signals are input to the multiplexer 150, wherein the A terminal 151 is connected to the first terminal 110, the B terminal 152 is connected to the output end of the current means sensing signal detection unit 140, that is, one terminal of the detection resistor 142, the C terminal 153 is connected to the second terminal 120, and the D terminal 154 is connected to the third terminal 130.

As described above, the multiplexer 150 transmits the external signals input to the A terminal 151, the B terminal 152, the C terminal 153, and the D terminal 154 to the control unit 180.

The power supply unit 160 serves to supply power for converting a change in a resistance value according to a change in temperature of the RTD temperature sensor 300 into voltage, is connected to the first terminal 110 and the A terminal 151 of the multiplexer 150, and receives the signal of the control unit 180 only when intending to receive the sensing signal of the RTD temperature sensor 300 to turn-on the switch 170 and apply power to the RTD temperature sensor 300.

The control unit 180 controls the multiplexer 150 to output one of the external signals received from the A terminal 151, the B terminal 152, the C terminal 153, and the D terminal 154, and converts the signal transmitted from the multiplexer 150 into a digital signal and transmits the digital signal to the display unit 200 so as to be displayed as a digital value. The key input unit 190 connected to the control unit 180 allows a user to set the sensor, the current means or the voltage means to be connected to the input port of the multiplexer 150, that is, each terminal 110 to 130 in the control unit 180, and the control unit 180 controls the multiplexer 150 and the switch 170 so as to meet the corresponding input.

Figure 5:
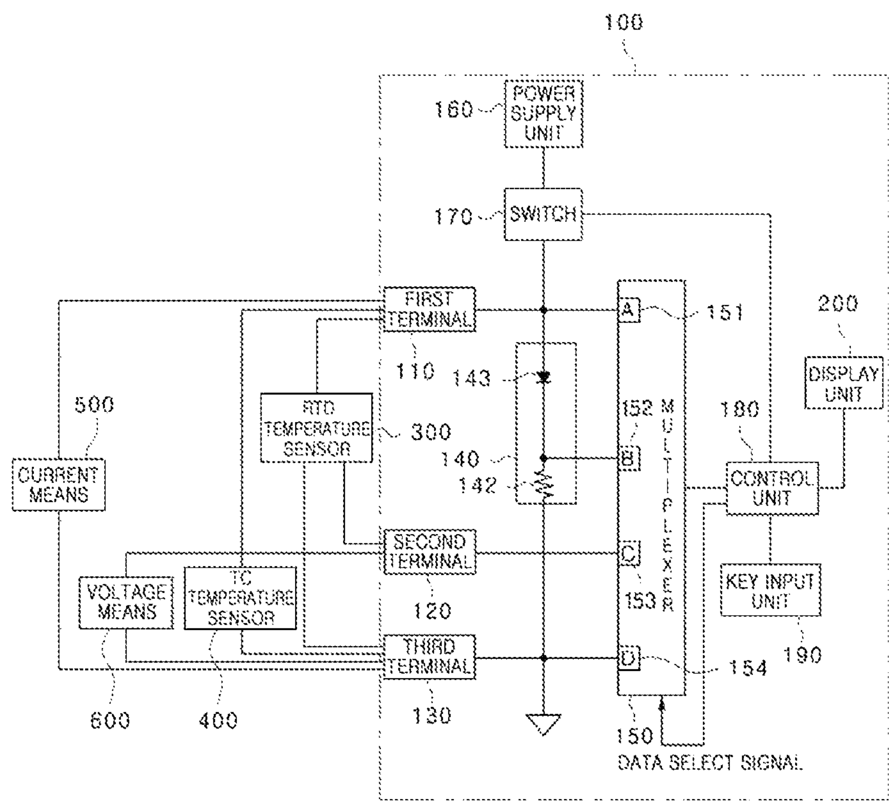
FIG. 5 is a diagram showing an exemplary embodiment of detecting a sensing signal of the current means of FIG. 4 using a diode and a detection resistor.

FIG. 5 shows an exemplary embodiment of the current means sensing signal detection unit 140 according to the exemplary embodiment of the present invention shown in FIG. 4 that consists of a diode and a detection resistor. Among components shown in FIG. 5, components having the same function as the components shown in FIG. 4 are denoted by the same reference numerals as reference numerals attached to the components shown in FIG. 4 and the detailed description thereof will be omitted herein so as to avoid the overlapping description.

One or more diode 143 used as the switching device 141 of the current means sensing signal detection unit 140 shown in FIG. 5 is connected between the first terminal 110 and the third terminal 130 in series. Herein, a P-N junction diode, a Schottky diode, a Zener diode, and the like, may be used as the diode 143.

As such a threshold voltage of the diode is defined by [Equation 1].

$$V_F = nV_T \ln\left(\frac{I}{I_s}\right)$$

Here, $V_F$ represents the threshold voltage of the diode, n represents an abnormal factor, I represents diode current, $I_S$ represents saturation current of the diode, $V_T$ represents Kt/q. In addition, in $V_T$, that is, kT/q, q represents $1.602176487\times10^{-19}$ [C], k represents $1.3806504\times10^{-23}$ [J/K], and T represents 300 K.

As such, the diode 143 has conduction voltage in a range of about 0.5 V to 1.0 V and has a temperature characteristic of −2 mV/° C. when the P-N junction diode is used. As such, the conduction voltage and the temperature characteristic of the diode 143 are exhibited when current is constant.

The detection resistor 142 is connected to the diode 143 in series between the first terminal 110 and the third terminal 130. The detection resistor 142 is to detect voltage flowing through the conducted diode 143. In addition, the detection resistor 142 is connected to the B terminal 152 of the multiplexer 150 to be described below to transmit a current signal with respect to a voltage drop generated by passing the current conducting the diode 143 through the detection resistor 142 to the B terminal 152.

That is, the diode 143 moves only the current signal input at voltage higher than the threshold voltage of the diode to the detection resistor 142 so that the current is detected at both ends of the detection resistor 142. As a result, it is possible to measure the sensing current of the current means 500 without being affected by the residual voltage of the diode.

Figure 6:
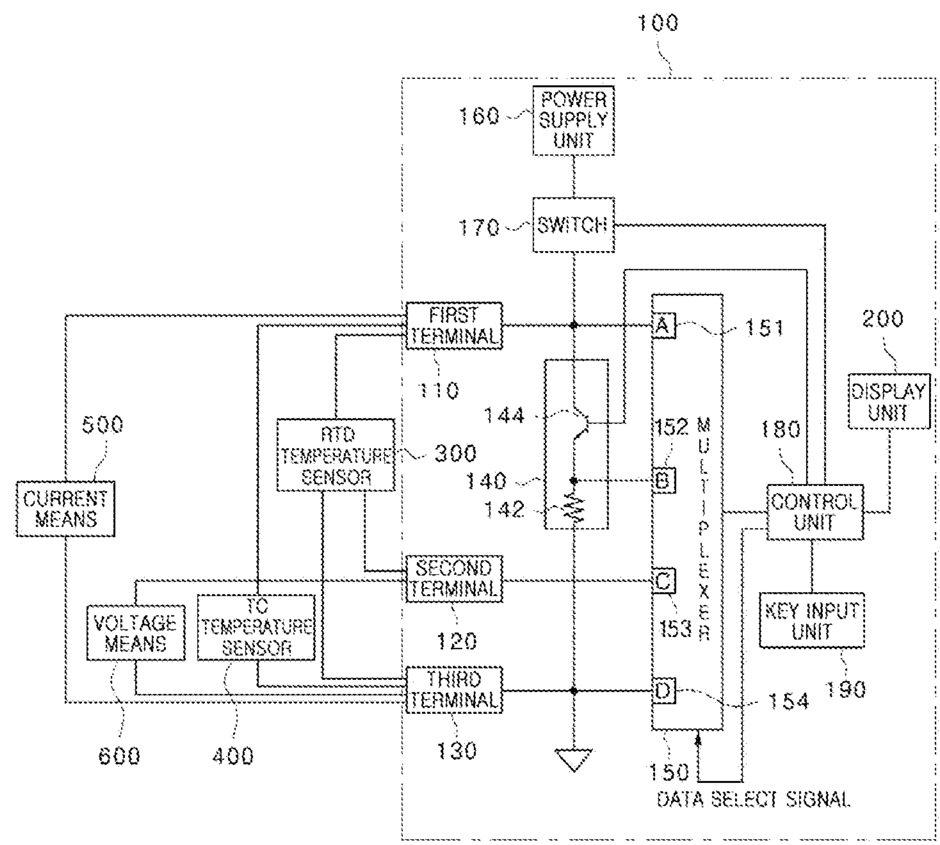
FIG. 6 is a diagram showing an exemplary embodiment of detecting the sensing signal of the current means of FIG. 4 using a transistor and the detection resistor.

FIG. 6 is a diagram showing an exemplary embodiment of detecting the sensing signal of the current means according to the exemplary embodiment of the present invention shown in FIG. 4 using a transistor and the detection resistor. Similarly to FIG. 5, among components shown in FIG. 6, components having the same function as the components shown in FIG. 4 are denoted by the same reference numerals as reference numerals attached to the components shown in FIG. 4 and the detailed description thereof will be omitted herein so as to avoid the overlapping description.

In FIG. 6, when a transistor 144 used as the switching device 141 of the current means sensing signal detection unit 140 is, for example, a PNP type transistor, a collector thereof is connected to the first terminal 110 and the A terminal 151 of the multiplexer 150, an emitter thereof is connected to the detection resistor 142 and the B terminal 152 of the multiplexer 150, and a base thereof is connected to the control unit 180 to turn-on the transistor 144 by the control signal of the control unit 180 only when the sensing signal of the current means 500 is input, thereby moving the current signal transmitted from the collector to the third terminal 130 via the detection resistor 142. In this case, the transistor 144 is configured to move the voltage generated at both ends of the detection resistor 142 to the B terminal 152 of the multiplexer 150.

Hereinafter, in the exemplary embodiment of the current means sensing signal detection unit 140 configured of the diode and the detection resistor, a process of inputting the temperature signal, the current signal, and the voltage signal input from the RTD temperature sensor 300, the TC temperature sensor 400, the current means 500, and the voltage means 600 to the multi input circuit 100 and a process of outputting the signal input to the multi input circuit 100 by the control unit 180 will be described in more detail.

First, when the RTD temperature sensor 300 is connected to the multi input circuit 100, the RTD temperature sensor 300 is connected to the first terminal 110, the second terminal 120, and the third terminal 130. In this case, the reason why the RTD temperature sensor 300 is connected to the first terminal 110, the second terminal 120, and the third terminal 130 is that the number of the connection terminals of the RTD temperature sensor 300 is three, including a compensation signal terminal.

As such, the switch 170 is turned-on by the control of the control unit 180 to supply the power supplied from the power supply unit 160 from the first terminal 110 to the RTD temperature sensor 300 connected to the first terminal 110, the second terminal 120, and the third terminal 130. As such, the power supplied to the first terminal 110 is supplied to the RTD temperature sensor 300 and then, flows to the third terminal 130.

Here, the signal voltage in proportion to a sum of line resistance of the RTD temperature sensor 300 connected to the first terminal 110, line resistance of the RTD temperature sensor 300 connected to the third terminal 130, and resistance of the RTD temperature sensor 300 is generated and input to the A terminal 151 of the multiplexer 150 and line voltage generated by the line resistance from the RTD temperature sensor 300 to the third terminal 130 is input to the C terminal 153 of the multiplexer 150 through the second terminal 120. In this case, the third terminal 130 and the D terminal 154 of the multiplexer 150 is on a common ground (GND) signal and the A terminal 151, B terminal 152, and C terminal 153 of the multiplexer 150 are not supplied with current due to high input impedance and therefore, do not affect a signal.

Generally, the RTD temperature sensor 300 has the same upper and lower line length and therefore, when a double value of the line voltage input to the C terminal 153 of the multiplexer 150 is subtracted from the signal voltage input to the A terminal 151 of the multiplexer 150, it is on a pure signal due to the RTD temperature sensor 300. This process is referred to as a line compensation. Therefore, the RTD temperature sensor 300 at which a temperature measuring point is far has line resistance of several Ω to several tens of Ω and therefore, the line compensation is necessary.

Further, the RTD temperature sensor 300 using a sensor having resistance of 100Ω at 0° C. which is generally in an output voltage range of a signal of 200 mV or less that does not reach the threshold voltage of the diode 143 disposed between the first terminal 110 and the third terminal 130 of the multiplexer 150 and therefore, cannot be conducted, such that there is no signal loss.

When the current means 500 is connected to the multi input circuit 100, the current means 500 is connected to the first terminal 110 and the third terminal 130 and the control unit 180 controls the switch 170 so as to be in a turn-off state, thereby blocking the supply of power from the power supply unit 160. Here, the analog current signal is output from the current means 500 and the analog current signal is input to the first terminal 110.

In this case, the analog current signal is generally a signal of 4 mA to 20 mA or 0 mA to 20 mA carried on a voltage of 10 V to 30 V and therefore, exceeds the threshold voltage of the diode 143 to conduct the diode 143. As such, a closed loop through which the conducted voltage flows through the third terminal 130 via the detection resistor 142 is formed. In this case, the voltage loss corresponding to the threshold voltage due to the diode 143 occurs, but the current signal loss does not occur, and therefore, the current signal with respect to the voltage drop generated due to the current signal flowing through both ends of the detection resistor 142 is input to the B terminal 152 of the multiplexer 150.

As described above, even though the temperature signal of the RTD temperature sensor 300 and the current signal of the current means 500 that are applied to the multi input circuit 100 are input through the same first terminal 110 and third terminal 130, each signal loss does not occur. Therefore, when the input signal is the temperature signal of the RTD temperature sensor 300, the control unit 180 selects the temperature signal input through the A terminal 151 of the multiplexer 150 as an output to measure the temperature signal and when the input signal is the current signal of the current means 500, the control unit 180 selects the current signal input through the B terminal 152 of the multiplexer 150 as an output to measure the current signal.

When the TC temperature sensor 400 is connected to the multi input circuit 100, the TC temperature sensor 400 may be connected to the first terminal 110 and the third terminal 130. In this case, the TC temperature sensor 400 itself generates voltage and thus, does not need to be supplied with power, such that the control unit 180 turns-off the switch 170 to block the supply of power from the power supply unit 160.

As described above, when the TC temperature sensor 400 is connected to the first terminal 110 and the third terminal 130, the temperature signal is input to the A terminal 151 of the multiplexer 150 through the first terminal 110 due to the ground connected to the third terminal 130 and the D terminal 154 of the multiplexer 150, such that the control unit 180 selects the temperature signal input through the A terminal 151 as an output to measure the temperature signal. In this case, the TC temperature sensor signal input through the first terminal 110 is 100 mV or less and therefore, does not conduct the diode 143 and is transmitted to the A terminal 151 of the multiplexer 150.

When the voltage means 600 is connected to the multi input circuit 100, the voltage means 600 is connected to the second terminal 120 and the third terminal 130 of the multiplexer 150 and when the voltage means 600 is used, the supply of power is not needed and therefore, the control unit 180 turns-off the switch 170 to block the supply of power from the power supply unit 160.

As such, when the voltage means 600 is used, since the voltage signal is input to the C terminal 153 of the multiplexer due to the ground connected to the third terminal 130 and the D terminal 154 of the multiplexer 150, the control unit 180 selects the voltage signal input through the C terminal 153 of the multiplexer 150 as an output to measure the voltage signal.

Next, in the exemplary embodiment of the current means sensing signal detection unit 140 configured of the transistor and the detection resistor, a process of inputting the temperature signal, the current signal, and the voltage signal input from the RTD temperature sensor 300, the TC temperature sensor 400, the current means 500, and the voltage means 600 to the multi input circuit 100 and a process of outputting the signal input to the multi input circuit 100 by the control unit 180 will be described in more detail.

The control unit 180 controls the transistor 144 to be in a turn-off state, except for the case in which the current signal of the current means 500 is measured.

In this state, similar to the above description, the RTD temperature sensor 300 is connected to the first terminal 110, the second terminal 120, and the third terminal 130 and supplied with power from the power supply unit 160 through the turned-on switch 170, such that the sensing signal of the RTD temperature sensor 300 is input to the A terminal 151, the C terminal 153, and the D terminal 154 of the multiplexer 150 from the first terminal 110, the second terminal 120, and the third terminal 130 without signal loss.

In addition, when the voltage means 600 is connected to the second terminal 120 and the third terminal 130, the control unit 180 selects the voltage signal input through the C terminal 153 as an output to perform the measurement. On the other hand, when the TC temperature sensor 400 is connected to the first terminal 110 and the third terminal 130, the transistor 144 is in a turned-off state and therefore, the temperature signal of the TC temperature sensor 400 is input to the A terminal 151 and the control unit 180 selects the temperature signal input through the A terminal 151 as an output to perform the measurement.

Further, when the current means 500 is connected to the multi input circuit 100, the current means 500 is connected to the first terminal 110 and the third terminal 130 and the control unit 180 controls the switch 170 to be in a turn-off state and controls the transistor 144 so as to be turned-on while blocking the supply of power from the power supply unit 160.

Therefore, the analog output current signal output from the current means 500 is input to the first terminal 110. A closed loop through which the analog current signal input to the first terminal 110 flows through the third terminal 130 via the turned-on transistor 144 and the detection resistor 142 is formed. In this case, the voltage loss corresponding to the saturation voltage due to the turned-on transistor 144 occurs but the current signal loss does not occur and therefore, the current signal with respect to the voltage drop generated due to the current signal flowing through both ends of the detection resistor 142 is input to the B terminal 152 of the multiplexer 150 and the control unit 180 selects the current signal input through the B terminal 152 as an output to perform the measurement.

The present specification describes the exemplary embodiments of the multi input circuit according to the present invention but the present invention is not limited thereto. The present invention may be variously modified within the following claims or the accompanying drawings, which belongs to the scope of the present invention.

REFERENCE SIGNS LIST

10: Input select switch
20: Detection resistor
100: Multi input circuit
110: First terminal
120: Second terminal
130: Third terminal
140: Current means sensing signal detection unit
141: Switching device
142: Detection resistor
143: Diode
144: Transistor
150: Multiplexer
160: Power supply unit
170: Switch
180: Control unit
190: Key input unit
200: Display unit
300: RTD temperature sensor
400: TC temperature sensor
500: Current means
600: Voltage means

The invention claimed is:

1. A multi input circuit, comprising:

a first terminal being supplied with sensing signals of a current means, an RTD (Resistance Temperature Detector) temperature sensor, and a TC (Thermo-Coupler) temperature sensor;

a second terminal being supplied with a compensation signal of the RTD (Resistance Temperature Detector) temperature sensor and a sensing signal of a voltage means;

a third terminal being supplied with a common signal of the current means, the RTD (Resistance Temperature Detector) temperature sensor, the TC (Thermo-Coupler) temperature sensor, and the voltage means and being grounded;

a current means sensing signal detection unit connected between the first terminal and the third terminal;

a multiplexer of which input ports are each connected to the first to third terminals and to an output end of the current means sensing signal detection unit;

a key input unit selecting the input ports for receiving the sensing signals from the multiplexer;

a power supply unit supplying power for sensing a change in a resistance value of the RTD (Resistance Temperature Detector) temperature sensor;

a switch turning-on/off power supplied to the RTD (Resistance Temperature Detector) temperature sensor from the power supply unit; and a control unit outputting a control signal selecting the input ports of the multiplexer and a control signal controlling the turn-on/off of the switch according to the selection of the key input unit receiving the sensing signal input to the input port of the multiplexer.

2. The multi input circuit of claim 1, wherein the current means sensing signal detection unit comprises a switching device and a detection resistor connected in series between the first terminal and the third terminal and a detection signal output end of the detection resistor is connected to one input port of the multiplexer.

3. The multi input circuit of claim 2, wherein the switching device consists of a diode and is configured to allow the detection resistor to detect only a current signal input at voltage higher than a threshold voltage of the diode.

4. The multi input circuit of claim 2, wherein the switching device consists of a transistor and is configured to input a control signal input from the control unit to the switching device into a base of the transistor at the time of measuring the sensing signal of the current means so as to turn-on the transistor.

5. The multi input circuit of claim 1, wherein when any one of the signals of the RTD (Resistance Temperature Detector) temperature sensor, the TC (Thermo-Coupler) temperature sensor, the current means, and the voltage means is input to the first terminal, the second terminal, and the third terminal, the control unit is configured to selectively receive the signal by the selection of the multiplexer.

6. The multi input circuit of claim 2, wherein when any one of the signals of the RTD (Resistance Temperature Detector) temperature sensor, the TC (Thermo-Coupler) temperature sensor, the current means, and the voltage means is input to the first terminal, the second terminal, and the third terminal, the control unit is configured to selectively receive the signal by the selection of the multiplexer.

7. The multi input circuit of claim 3, wherein when any one of the signals of the RTD (Resistance Temperature Detector) temperature sensor, the TC (Thermo-Coupler) temperature sensor, the current means, and the voltage means is input to the first terminal, the second terminal, and the third terminal, the control unit is configured to selectively receive the signal by the selection of the multiplexer.

8. The multi input circuit of claim 4, wherein when any one of the signals of the RTD (Resistance Temperature Detector) temperature sensor, the TC (Thermo-Coupler) temperature sensor, the current means, and the voltage means is input to the first terminal, the second terminal, and the third terminal, the control unit is configured to selectively receive the signal by the selection of the multiplexer.

* * * * *